United States Patent
Kim

(10) Patent No.: US 9,606,174 B2
(45) Date of Patent: Mar. 28, 2017

(54) SEMICONDUCTOR DEVICE THAT SUPPORTING A BUILT-IN SELF-TEST (BIST) OPERATION AND MULTI-SEMICONDUCTOR PACKAGE INCLUDING THE SAME

(71) Applicant: SK hynix Inc., Gyeonggi-do (KR)

(72) Inventor: Dae-Suk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/667,096

(22) Filed: Mar. 24, 2015

(65) Prior Publication Data

US 2016/0097809 A1    Apr. 7, 2016

(30) Foreign Application Priority Data

Oct. 1, 2014 (KR) .......................... 10-2014-0132539

(51) Int. Cl.
*G01R 31/317* (2006.01)
*G01R 31/3187* (2006.01)

(52) U.S. Cl.
CPC ... G01R 31/31724 (2013.01); G01R 31/3187 (2013.01)

(58) Field of Classification Search
CPC .......... G01R 31/31724; G01R 31/3187; G01R 31/2856; G01R 31/31722; G01R 31/31723; G01R 31/318558; G01R 31/31926; G01R 31/2884; G01R 31/31703; G01R 31/3177; G01R 31/31908; G11C 29/12; G11C 29/18; G11C 29/16; G11C 29/44; G11C 29/48; G06F 11/27; H01L 2224/0401
USPC .......................... 714/718, 733; 324/754, 755
See application file for complete search history.

(56) References Cited

U.S. PATENT DOCUMENTS

| | | | | |
|---|---|---|---|---|
| 6,845,477 B2* | 1/2005 | Hidaka | ................ | G11C 29/48 324/757.03 |
| 6,907,555 B1* | 6/2005 | Nomura | ................ | G11C 29/44 714/719 |
| 7,400,134 B2* | 7/2008 | Morishita | ........ | G01R 31/31701 257/48 |
| 7,774,667 B2* | 8/2010 | Saito | ................ | G11C 29/1201 714/718 |
| 2002/0031025 A1* | 3/2002 | Shimano | ............... | G11C 29/44 365/201 |

FOREIGN PATENT DOCUMENTS

KR    1020110075619    7/2011

* cited by examiner

*Primary Examiner* — Cynthia Britt
(74) *Attorney, Agent, or Firm* — IP & T Group LLP

(57) ABSTRACT

A semiconductor device includes a built-in self-test controller suitable for generating a test command and test data, and generating a test result signal in response to test result data, in a built-in self-test mode, an internal circuit suitable for performing a test operation in response to the test command and the test data and generating the test result data as a result of the test operation, and a signal transfer controller suitable for outputting the test command, the test data, and the test result signal through a set probe pad and a set bump pad in the built-in self-test mode.

18 Claims, 4 Drawing Sheets

SEMICONDUCTOR DEVICE THAT SUPPORTING A BUILT-IN SELF-TEST (BIST) OPERATION AND MULTI-SEMICONDUCTOR PACKAGE INCLUDING THE SAME

CROSS-REFERENCE TO RELATED APPLICATIONS

The present application claims priority of Korean Patent Application No. 10-2014-0132539, filed on Oct. 1, 2014, which is incorporated herein by reference in its entirety.

BACKGROUND

1. Field

Exemplary embodiments of the present invention relate to a semiconductor designing technology, and more particularly, to a semiconductor device that supports a built-in self-test (BIST) operation.

2. Description of the Related Art

As semiconductor fabrication technology advances, the integration degree of semiconductor devices is increased and the possibility of the semiconductor devices malfunctioning also increases. Problems in the fabrication process of semiconductor devices may be figured out by analyzing the malfunctions of the semiconductor devices, and this problem tracking process is important.

Semiconductor devices are tested using external test equipment. However, as multi-semiconductor package technology, where a plurality of semiconductor devices are mounted on one package is introduced, the conventional way of testing semiconductor devices needs changing. Multi-semiconductor packages use a plurality of internal memories having wide data input/output (I/O) bandwidth for improved performance. It becomes inefficient to test the memories inside the multi-semiconductor package with conventional testing equipment, due to lack of channels on the test equipment, limitations in high-speed testing, and low accessibility to the internal memories.

To alleviate such issues, a method of including a built-in self-test (BIST) circuit inside the multi-semiconductor package is suggested. Since this method is advantageous in terms of high-speed testing over the conventional method, it has been developed and, nowadays, it is widely used as a method for testing internal memories of multi-semiconductor packages.

SUMMARY

An embodiment of the present invention is directed to a semiconductor device capable of monitoring a test command and test data that are used for a built-in self-test (BIST) operation from the outside of the semiconductor device.

Another embodiment of the present invention is directed to a multi-semiconductor package that may transfer a test command and test data that are used for a built-in self-test operation of one semiconductor device to other semiconductor devices inside the multi-semiconductor package to perform built-in self-test operations of the other semiconductor devices.

In accordance with an embodiment of the present invention, a semiconductor device includes a built-in self-test controller suitable for generating a test command and test data, and generating a test result signal in response to test result data, in a built-in self-test mode, an internal circuit suitable for performing a test operation in response to the test command and the test data and generating the test result data as a result of the test operation, and a signal transfer controller suitable for outputting the test command, the test data, and the test result signal through a set probe pad and a set bump pad in the built-in self-test mode.

The signal transfer controller may receive a built-in self-test enable signal for deciding whether to enter the built-in self-test mode through the set bump pad or the set probe pad.

The built-in self-test controller may include a test command generation unit suitable for generating the test command in response to the built-in self-test enable signal, a test data generation unit suitable for generating the test data in response to the built-in self-test enable signal, and a test result signal generation unit suitable for generating the test result signal in response to the test result data.

The signal transfer controller may receive a normal command through a command bump pad of the set bump pad and may input/output normal data through a data bump pad of the set bump pad, in a normal mode.

The signal transfer controller may output the test command through the command bump pad and the set probe pad, and may output the test data and the test result signal through the data bump pad and the set probe pad, in the built-in self-test mode.

The signal transfer controller may serialize the test command, the test data, and the test result signal in a predetermined sequence and may output the test command, the test data, and the test result signal through the set probe pad, in the built-in self-test mode.

The signal transfer controller may output the test command, the test data, and the test result signal in parallel through first to third probe pads of the set probe pad, respectively, in the built-in self-test mode.

In accordance with another embodiment of the present invention, a multi-semiconductor package includes a first semiconductor device suitable for receiving a test command and test data through a first bump pad, performing a first test operation to produce first test result data as a result of the first test operation, and outputting the first test result data through the first bump pad, in a built-in self-test mode, and a second semiconductor device suitable for generating the test command and the test data inside, performing a second test operation to generate second test result data as a result of the second test operation, generating a second test result signal corresponding to the second test result data and a first test result signal corresponding to the first test result data which is inputted through a second bump pad, and outputting the test command, the test data, the first test result signal, and the second test result signal through the second bump pad and a set probe pad, in the built-in self-test mode.

The first semiconductor device may include a first internal circuit suitable for performing the first test operation in response to the test command and the test data and generating the first test result data as the result of the first test operation, and a first signal transfer controller suitable for receiving the test command and the test data through the first bump pad, and outputting the first test result data through the first bump pad in the built-in self-test mode.

The first signal transfer controller may receive a built-in self-test enable signal for deciding whether to enter the built-in self-test mode through the first bump pad.

The first signal transfer controller may receive a normal command through a first command bump pad of the first bump pad and input/output normal data through a first data bump pad of the first bump pad, in a normal mode.

The first signal transfer controller may receive the test command through the first command bump pad, and the test data through the first data bump pad, and output the first test result data through the first data bump pad, in the built-in self-test mode The second semiconductor device may include a built-in self-test controller suitable for generating the test command and the test data, generating the first test result signal in response to the first test result data, and generating the second test result signal in response to the second test result data in the built-in self-test mode, a second internal circuit suitable for performing the second test operation in response to the test command and the test data and generating the second test result data as the result of the second test operation, and a second signal transfer controller suitable for receiving the first test result data through the second bump pad, and outputting the test command, the test data, the first test result signal, and the second test result signal through the set probe pad and the second bump pad, in the built-in self-test mode.

The second signal transfer controller may receive a built-in self-test enable signal for deciding whether to enter the built-in self-test mode through the second bump pad or the set probe pad.

The built-in self-test controller may include a test command generation unit suitable for generating the test command in response to the built-in self-test enable signal, a test data generation unit suitable for generating the test data in response to the built-in self-test enable signal, and a test result signal generation unit suitable for generating the first test result signal in response to the first test result data and generating the second test result signal in response to the second test result data.

The second signal transfer controller may receive a normal command through a second command bump pad of the second bump pad and input/output normal data through a second data bump pad of the second bump pad, in a normal mode.

The second signal transfer controller may receive the first test result data through the second data bump pad, and output the test command through the second command bump pad and the set probe pad, and the test data, the first test result signal, and the second test result signal through the second data bump pad and the set probe pad, in the built-in self-test mode.

The second signal transfer controller may serialize the test command, the test data, the first test result signal and the second test result signal in a predetermined sequence and output the test command, the test data, the first test result signal and the second test result signal through the set probe pad, in the built-in self-test mode.

The second signal transfer controller may output the test command, the test data, the first test result signal, and the second test result signal in parallel through first to fourth probe pads of the set probe pad, respectively in the built-in self-test mode.

When the built-in self-test enable signal is inputted to the second semiconductor device through the set probe pad, the second signal transfer controller may output the built-in self-test enable signal through the second bump pad to transmit the built-in self-test enable signal to the first semiconductor device.

In accordance with another embodiment of the present invention, a multi-semiconductor package includes a plurality of semiconductor devices each suitable for performing a test operation in response to a test command and test data and generating a test result data as a result of the test operation, in a built-in self-test mode, wherein one of the semiconductor devices includes a built-in self-test controller suitable for generating the test command and the test data, and generating a test result signal corresponding to the test result data, and outputs the test command, the test data, and the test result signal through a probe pad thereof, in the built-in self-test mode.

The one of the semiconductor devices may transmit the test command, and the test data through a bump pad thereof to the other semiconductor devices, among the plurality of semiconductor devices, while receiving the test result data from the other semiconductor devices through the bump pad.

DETAILED DESCRIPTION

Figure 1A:
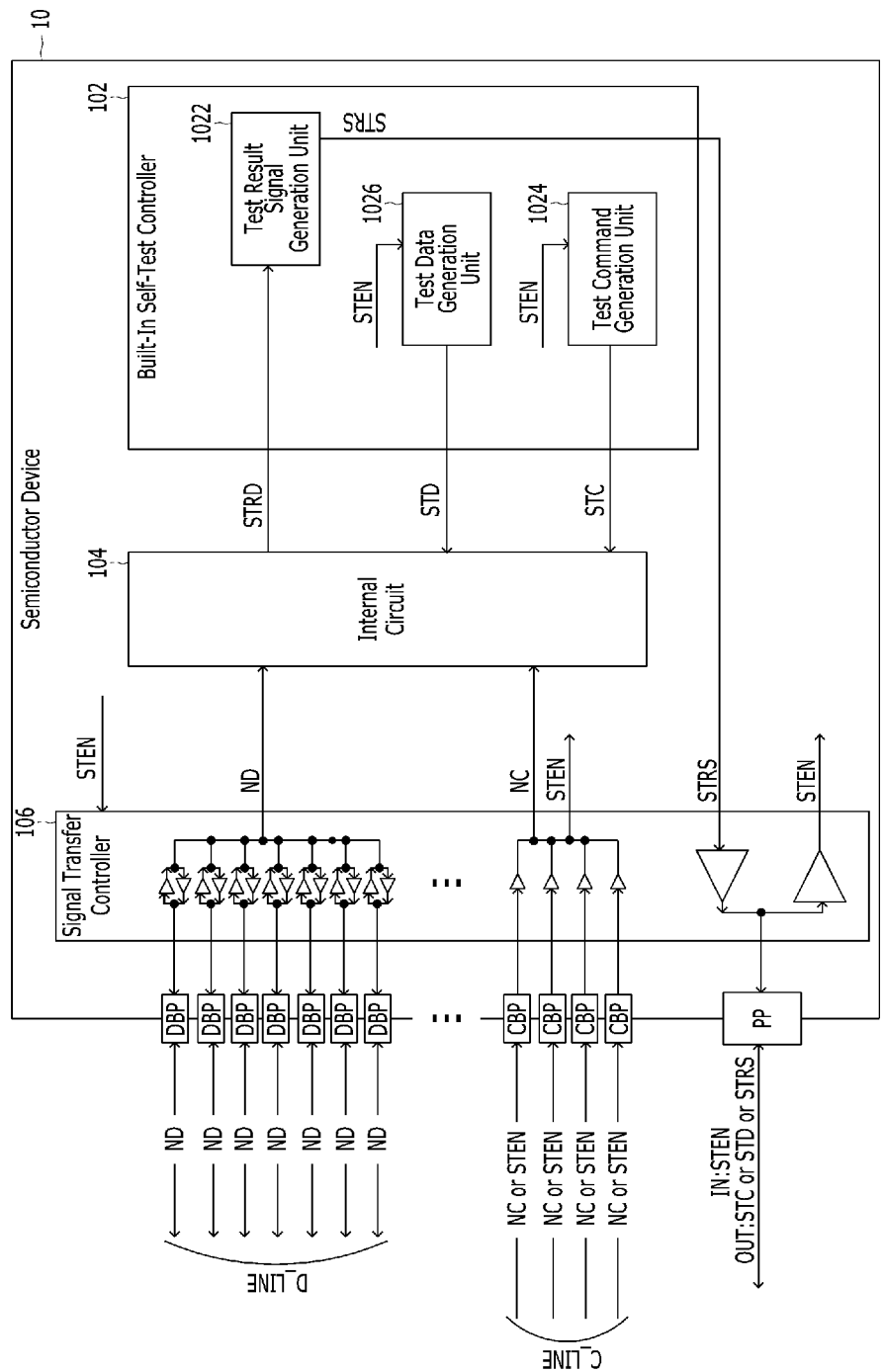
FIG. 1A is a block diagram illustrating a general semiconductor device that supports a built-in self-test (BIST) operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1A is a block diagram illustrating a general semiconductor device that supports a built-in self-test (BIST) operation.

Referring to FIG. 1A, the general semiconductor device 10 that supports a built-in self-test operation includes a built-in self-test controller 102 an internal circuit 104, and a signal transfer controller 106. Also, the general semiconductor device 10 further includes a set bump pad DBP and CBP and a set probe pad PP. Herein, the built-in self-test controller 102 includes a test result signal generation unit 1022, a test command generation unit 1024, and a test data generation unit 1026.

The built-in self-test controller 102 generates a test command STC and test data STD when a built-in self-test mode begins, and generates a test result signal STRS in response to test result data STRD.

The test command generation unit 1024 generates the test command STC in response to a built-in self-test enable signal STEN. In other words, the test command generation unit 1024 generates the test command STC in a section where the built-in self-test enable signal STEN is enabled.

The test data generation unit 1026 generates the test data STD in response to the built-in self-test enable signal STEN. In short, the test data generation unit 1026 generates the test data STD in a section where the built-in self-test enable signal STEN is enabled.

The test command STC and the test data STD may be diverse forms of signals corresponding to diverse test operations, and when and how they are generated may be pre-set in the process of circuit design. For example, it may be pre-set that one test command STC and one test data STD are generated whenever an operation clock (not shown) toggles N times from a moment when the built-in self-test enable signal STEN is enabled.

The test result signal generation unit 1022 generates the test result signal STRS in response to the test result data STRD. In other words, the internal circuit 104 performs a test operation in response to the test command STC and the test data STD, and the test result signal generation unit 1022 sees if the test result data STRD generated as a result of the test operation has a pre-defined normal value to decide the value of the test result signal STRS. For example, if the test result data STRD has the predetermined normal value, it may be decided that the internal circuit 104 performs a normal operation. Thus, the test result signal generation unit 1022 may generate the test result signal STRS having a value representing 'test succeeded'. Conversely, if the test result data STRD does not have the predetermined normal value, it may be decided that the internal circuit 104 does not perform a normal operation. Thus, the test result signal generation unit 1022 may generate the test result signal STRS having a value representing 'test failed'.

Herein, the test result signal generation unit 1022 may be able to decide whether the test result data STRD has the predetermined normal value because the test result signal generation unit 1022 is disposed inside the built-in self-test controller 102 and already knows the values of the test command STC and the test data STD. In other words, the test result signal generation unit 1022 may know in advance what test operation is to be performed in the internal circuit 104 in response to the test command STC and the test data STD, and this means that it may be known in advance what value the test result data STRD has when the test operation is performed properly. Therefore, the test result signal generation unit 1022 may generate the test result signal STRS that represents whether the test operation is performed properly inside the internal circuit 104 based on the test result data STRD.

The internal circuit 104 performs the test operation in response to the test command STC and the test data STD and generates the test result data STRD as a result of the test operation. Herein, the test operations performed in the internal circuit 104 may be diverse and what test operation is to be performed and how the test operation is to be performed may be decided in the process of circuit design, in advance.

The signal transfer controller 106 outputs the test result signal STRS to the set probe pad PP when the built-in self-test mode begins, Since the test result signal STRS is outputted to the set probe pad PP through the signal transfer controller 106, it is possible to check the value of the test result signal STRS through the set probe pad PP by using a probe of the test equipment outside the semiconductor device 10. In short, it is possible to check whether the built-in self-test operation performed in the semiconductor device 10 has succeeded or failed even outside of the semiconductor device 10.

Also, the signal transfer controller 106 receives the built-in self-test enable signal STEN for deciding whether to enter the built-in self-test mode through the set bump pad DBP and CBP or the set probe pad PP. In other words, the built-in self-test enable signal STEN may be transmitted from the outside (e.g. from an external device or test equipment) of the semiconductor device 10 to the inside of the semiconductor device 10 through a probe of the test equipment, or the built-in self-test enable signal STEN generated inside a semiconductor device controller (not shown) may be transmitted from the outside of the semiconductor device 10 to the inside of the semiconductor device 10. The input route of the built-in self-test enable signal STEN may be pre-set in the process of circuit design. Herein, FIG. 1A shows that the built-in self-test enable signal STEN is directly inputted through the set bump pad DBP and CBP and the set probe pad PP, but this is merely an example, and there may be other methods. For example, the built-in self-test enable signal STEN may be generated inside the semiconductor device 10 by decoding an input signal through a command decoding operation according to another embodiment of the present invention.

Also, the signal transfer controller 106 receives a normal command NC through a set command bump pad CBP of the set bump pad DBP and CBP and inputs/outputs normal data ND through a set data bump pad DBP of the set bump pad DBP and CBP, during a normal mode. In other words, the set bump pad DBP and CBP may be used as the path where the built-in self-test enable signal STEN, used for entering the built-in self-test mode is inputted, but they are usually used for receiving the normal command NC and inputting/outputting the normal data ND, during a normal mode. Meanwhile, the set probe pad PP is used for inputting/outputting a signal that is used when the built-in self-test mode begins/ends. In other words, the set probe pad PP is used for inputting/outputting the test result signal STRS and the built-in self-test enable signal STEN.

Hereafter, a built-in self-test operation of the general semiconductor device 10 having the above-described structure is described.

First of all, the semiconductor device 10 enters the built-in self-test mode in response to the enabling of the built-in self-test enable signal STEN that is inputted through the set bump pad DBP and CBP or the probe pad PP.

When the built-in self-test enable signal STEN is enabled, the built-in self-test controller 102 generates the test command STC and the test data STD. To be specific, the test data generation unit 1026 generates the test data STD, and the test command generation unit 1024 generates the test command STC.

The internal circuit 104 performs a predetermined test operation in response to the test command STC and the test data STD, and generates the test result data STRD, which is a value obtained from the test operation. For example, when it is described as an example that the internal circuit 104 is a circuit for storing data, the internal circuit 104 may decide whether data are properly stored inside the internal circuit 104 and output the decision result as the test result data STRD.

When the internal circuit 104 generates the test result data STRD, the test result signal generation unit 1022 generates the test result signal STRS that represents whether the test operation is properly performed in the internal circuit 104 in response to the test result data STRD. The generated test result signal STRS is outputted to the outside of the semiconductor device 10 through the set probe pad PP. Therefore, it is possible to know whether the built-in self-test operation is properly performed inside the semiconductor device 10 from outside of the semiconductor device 10.

Meanwhile, in the general semiconductor device 10 described above, the test command STC and the test data STD that are used for the built-in self-test operation are directly generated and used inside the semiconductor device 10. Herein, although the values of the test command STC and the test data STD used for the built-in self-test operation are predetermined, they are hidden while the built-in self-test operation is actually performed, and only the value of the test result signal STRS generated as a result of performing the built-in self-test operation may be seen from outside of the semiconductor device 10. Therefore, it may not be seen from outside of the semiconductor device 10 whether the test command STC and the test data STD used for the built-in self-test operation inside the semiconductor device 10 are actually generated to have intended values. Therefore, in the worst case, although the internal circuit 104 performs a built-in self-test operation unintentionally in response to the generation of unintended test command STC and test data STD and outputs the test result signal STRS representing 'test succeeded' to the outside of the semiconductor device 10, there is no way to know it from outside of the semiconductor device 10.

Figure 1B:
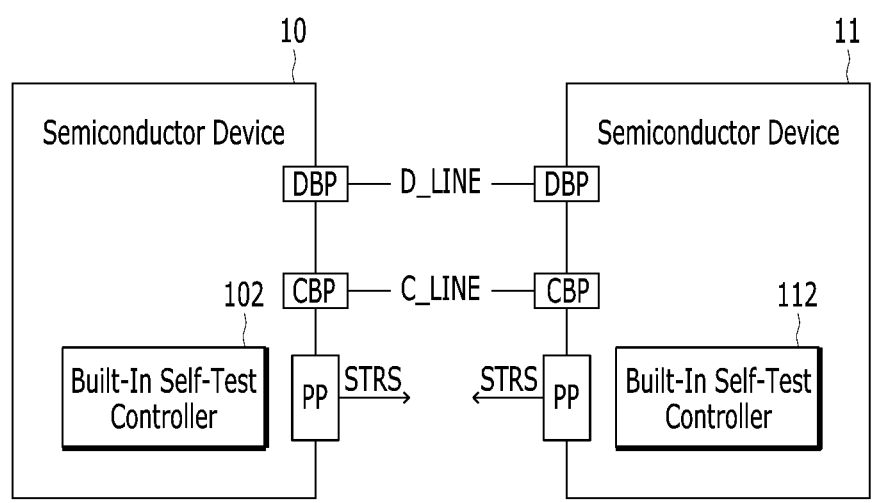
FIG. 1B is a block diagram illustrating a multi-semiconductor package where a plurality of general semiconductor devices that support the built-in self-test operation shown in FIG. 1A are packaged.

Also, since the test command STC and the test data STD used for the built-in self-test operation inside the semiconductor device 10 are generated and used while hidden inside the general semiconductor device 10 as described above, the test command STC and the test data STD are effective signals only inside the semiconductor device 10. Therefore, when the technology is applied to the multi-semiconductor package where a plurality of semiconductor devices 10 and 11 are packaged as illustrated in FIG. 1B, the semiconductor devices 10 and 11 have to include the built-in self-test controllers 102 and 112, respectively.

Figure 2:
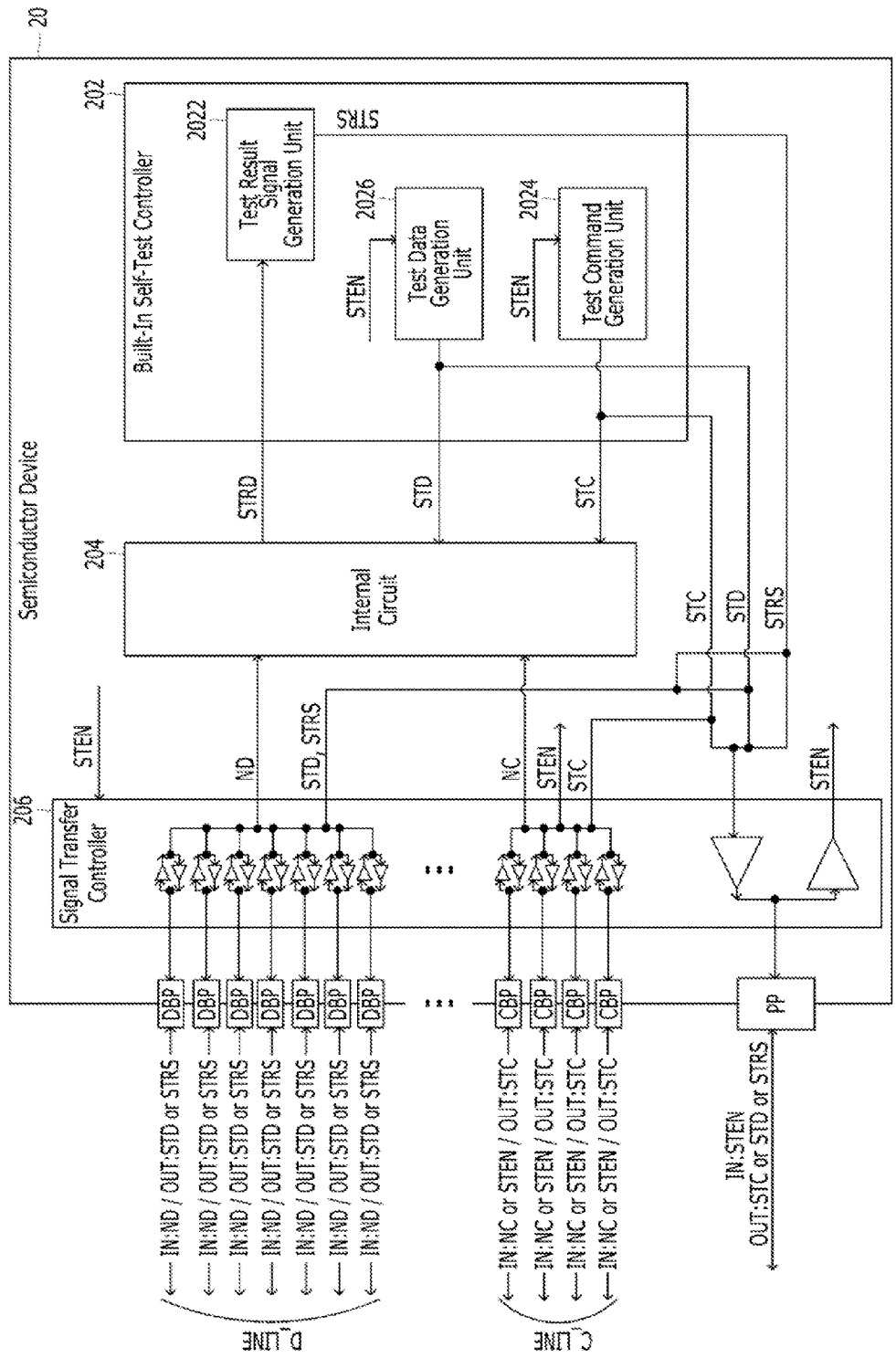
FIG. 2 is a block diagram illustrating a semiconductor device that supports a built-in self-test operation in accordance with an embodiment of the present invention.

FIG. 2 is a block diagram illustrating a semiconductor device that supports a built-in self-test operation in accordance with an embodiment of the present invention.

Referring to FIG. 2, the semiconductor device 20 that supports the built-in self-test operation in accordance with the embodiment of the present invention includes a built-in self-test controller 202, an internal circuit 204, and a signal transfer controller 206. Also, the semiconductor device 20 further includes a set bump pad DBP and CBP and a set probe pad PP. Herein, the built-in self-test controller 202 includes a test result signal generation unit 2022, a test command generation unit 2024, and a test data generation unit 2026.

The built-in self-test controller 202 generates a test command STC and a test data STD when a built-in self-test mode begins, and generates a test result signal STRS in response to a test result data STRD.

The test command generation unit 2024 generates the test command STC in response to a built-in self-test enable signal STEN. In other words, the test command generation unit 2024 generates the test command STC in a section where the built-in self-test enable signal STEN is enabled.

The test data generation unit 2026 generates the test data STD in response to the built-in self-test enable signal STEN. In short, the test data generation unit 2026 generates the test data STD in a section where the built-in self-test enable signal STEN is enabled.

The test command STC and the test data STD may be diverse forms of signals corresponding to diverse test operations, and when and how they are generated may be pre-set in the process of circuit design. For example, it may be pre-set that one test command STC and one test data STD are generated whenever an operation clock (not shown) toggles N times from a moment when the built-in self-test enable signal STEN is enabled.

The test result signal generation unit 2022 generates the test result signal STRS in response to the test result data STRD. In other words, the internal circuit 204 performs a test operation in response to the test command STC and the test data STD, and the test result signal generation unit 2022 sees if the test result data STRD generated as a result of the test operation has a pre-defined normal value to decide the value of the test result signal STRS. For example, if the test result data STRD has the predetermined normal value, it may be decided that the internal circuit 204 performs a normal operation. Thus, the test result signal generation unit 2022 may generate the test result signal STRS having a value representing 'test succeeded'. Conversely if the test result data STRD does not have the predetermined normal value, it may be decided that the internal circuit 204 does not perform a normal operation. Thus, the test result signal generation unit 2022 may generate the test result signal STRS having a value representing 'test failed'.

Herein, the test result signal generation unit 2022 may be able to decide whether the test result data STRD has the predetermined normal value because the test result signal generation unit 2022 is disposed inside the built-in self-test controller 202 and already knows the values of the test command STC and the test data STD. In other words, the test result signal generation unit 2022 may know in advance what test operation is to be performed in the internal circuit 204 in response to the test command STC and the test data STD, and this means that it may be known in advance what value the test result data STRD has when the test operation is performed properly. Therefore, the test result signal generation unit 2022 may generate the test result signal STRS that represents whether the test operation is performed properly inside the internal circuit 204 based on the test result data STRD.

The internal circuit 204 performs the test operation in response to the test command STC and the test data STD and generates the test result data STRD as a result of the test operation. The test operations performed in the internal circuit 204 may be diverse and what test operation is to be performed and how the test operation is to be performed may be decided in the process of circuit design, in advance.

The signal transfer controller 206 outputs the test command STC, the test data STD, and the test result signal STRS to the set probe pad PP when the built-in self-test mode begins. Since not only the test result signal STRS but also the test command STC and the test data STD are outputted to the set probe pad PP through the signal transfer controller 206, it is possible not only to check the value of the test result signal STRS but also to check the values of the test command STC and the test data STD through the set probe pad PP by using a probe of the test equipment from outside the semiconductor device 20. It may be known what test operation is performed inside the semiconductor device 20. In short, it is possible to know what built-in self-test operation is performed inside the semiconductor device 20 and whether the built-in self-test operation performed in the semiconductor device 20 has succeeded or failed even from outside of the semiconductor device 20.

Meanwhile, it may be seen from FIG. 2 that all of the test command STC, the test data STD and the test result signal STRS are outputted through one set probe pad PP. When the test command STC and the test data STD that may be generated with similar timing are outputted together through the one set probe pad PP, they may collide with each other. Therefore, although not illustrated in FIG. 2 specifically, the signal transfer controller 206 may perform an additional operation of serializing the test command STC, the test data STD, and the test result signal STRS in a predetermined sequence and outputting them through the one set probe pad PP. Alternatively, the semiconductor device 20 may include more than one set probe pad PP and output the test command STC, the test data STD, and the test result signal STRS in parallel. For example, the test command STC may be outputted through a first probe pad (not shown), and the test data STD may be outputted through a second probe pad (not shown), while the test result signal STRS may be outputted through a third probe pad (not shown).

The signal transfer controller 206 outputs the test command STC, the test data STD and the test result signal STRS through the bump pad DBP and CBP as well as the set probe pad PP, when the built-in self-test mode begins. Since the test command STC, the test data STD and the test result signal STRS are outputted by the signal transfer controller 206 through the bump pad DBP and CBP, it is possible for a semiconductor controller (not shown) or another semiconductor device (not shown) that is coupled with the semiconductor device 20 through the set bump pad DBP and CBP to receive the test command STC, the test data STD and the test result signal STRS and use them according to predetermined purposes. For example, another semiconductor device (not shown) that shares a command line C_LINE and a data line D_LINE with the semiconductor device 20 shown in FIG. 2 may receive the test command STC and the test data STD that are generated inside the semiconductor device 20 as they are, and perform the same test operation as the test operation performed in the semiconductor device 20. Also, the semiconductor controller (not shown) that shares a command line C_LINE and a data line D_LINE with the semiconductor device 20 shown in FIG. 2 may figure out what built-in self-test operation is performed inside the semiconductor device 20 and whether the built-in self-test operation performed inside the semiconductor device 20 has succeeded or failed by receiving the test command STC and the test data STD that are generated inside the semiconductor device 20. With this information, the semiconductor controller may efficiently control the operation of the semiconductor device 20.

Also, the signal transfer controller 206 receives the built-in self-test enable signal STEN for deciding whether to enter the built-in self-test mode or not through the set bump pad DBP and CBP or the set probe pad PP. In other words, the built-in self-test enable signal STEN may be transmitted from outside of the semiconductor device 20 to inside the semiconductor device 20 through a probe of the test equipment, or the built-in self-test enable signal STEN generated inside the semiconductor device controller (not shown) may be transmitted from outside the semiconductor device 20 to inside the semiconductor device 20, for the semiconductor device 20 to enter the built-in self-test mode. The input route of the built-in self-test enable signal STEN may be pre-set in the process of circuit design. Herein, FIG. 2 shows that the built-in self-test enable signal STEN is directly inputted through the set bump pad DBP and CBP and the set probe pad PP, but this is merely an example, and there may be other methods. For example, the built-in self-test enable signal STEN may be generated inside the semiconductor device 20 by decoding an input signal through a command decoding operation according to another embodiment of the present invention.

Also, the signal transfer controller 206 receives a normal command NC through a set command bump pad CBP of the set bump pad DBP and CBP and inputs/outputs normal data ND through a set data bump pad DBP of the set bump pad DBP and CBP, during a normal mode. In other words, the set bump pad DBP and CBP may be used to receive the normal command NC and input/output the normal data ND when the normal mode begins, and is used to input/output the test command STC, the test data STD, and the test result signal STRS in the built-in self-test mode. In particular, differently from the general semiconductor device 10 shown in FIG. 1A, the semiconductor device 20 in accordance with the embodiment of the present invention uses the set command bump pad CBP not only to receive the normal command NC or the built-in self-test enable signal STEN but also to output the test command STC. Therefore, the signal transfer controller 206 includes both a signal input buffer and a signal output buffer that correspond to the set command bump pad CBP.

Hereafter, a built-in self-test operation of the semiconductor device 20 having the above-described structure in accordance with the embodiment of the present invention is described.

First of all, the semiconductor device 20 enters the built-in self-test mode in response to the enabling of the built-in self-test enable signal STEN that is putted through the set bump pad DBP and CBP or the probe pad PP.

When the built-in self-test enable signal STEN is enabled, the built-in self-test controller 202 generates the test command STC and the test data STD. To be specific, the test data generation unit 2026 generates the test data STD, and the test command generation unit 2024 generates the test command STC. The test command STC and the test data STD generated in the test command generation unit 2024 and the test data generation unit 2026 are transmitted to the internal circuit 204 while being outputted to the outside of the semiconductor device 20 through the set bump pad DBP and CBP and the set probe pad PP, simultaneously.

The internal circuit 204 performs a predetermined test operation in response to the test command STC and the test data STD, and generates the test result data STRD, which is a value obtained from the test operation. For example, when it is described as an example that the internal circuit 204 is a circuit for storing data, the internal circuit 204 may decide whether data are properly stored inside the internal circuit 204 and output the decision result as the test result data STRD.

When the internal circuit 204 generates the test result data STRD, the test result signal generation unit 2022 generates the test result signal STRS that represents whether the test operation is properly performed in the internal circuit 204 in response to the test result data STRD. The generated test result signal STRS is outputted to the outside of the semiconductor device 20 through the set probe pad PP and the set bump pad DBP and CBP. Therefore, it is possible to know from outside of the semiconductor device 20 whether the built-in self-test operation is properly performed inside the semiconductor device 20.

Figure 3:
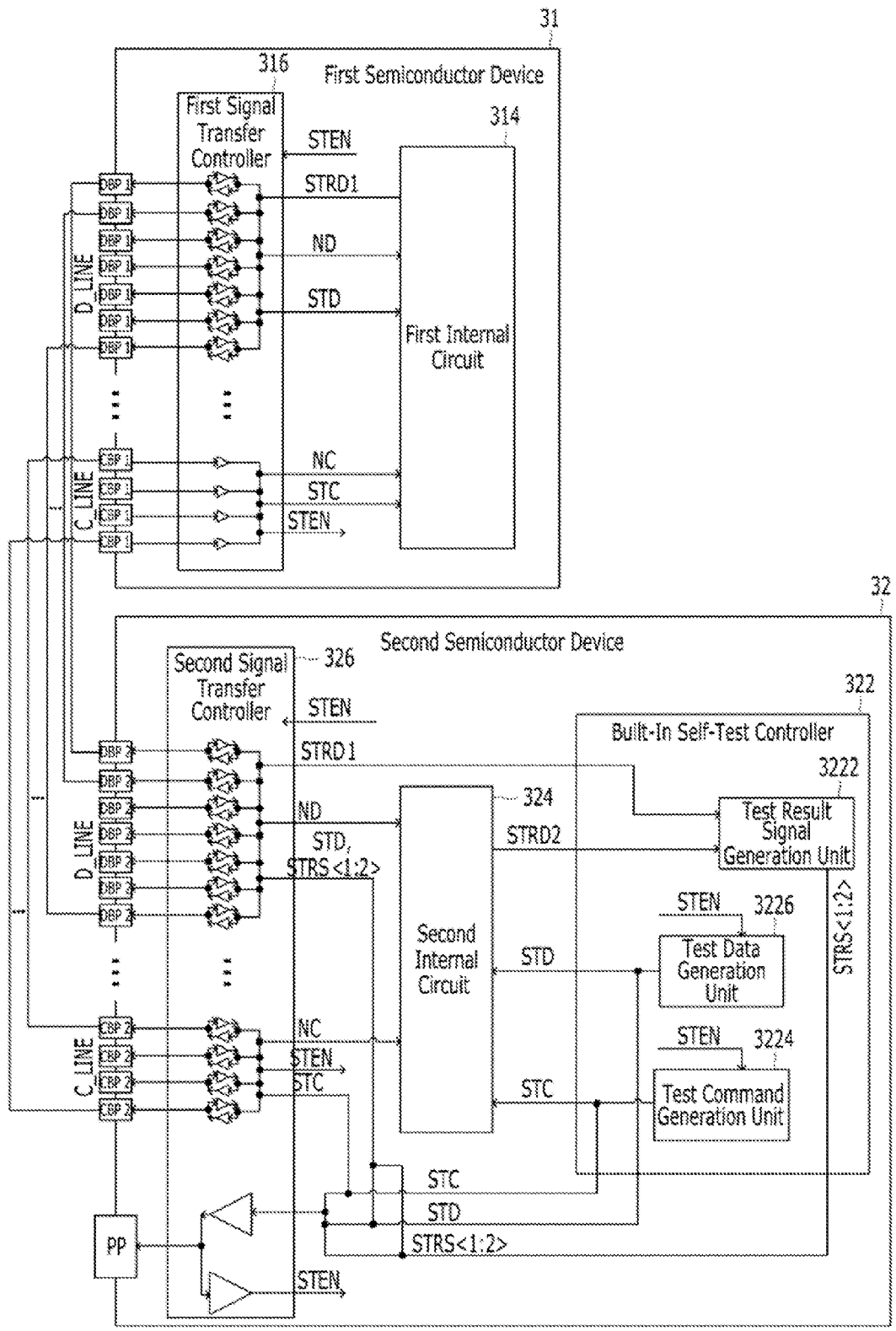
FIG. 3 is a block diagram illustrating a multi-semiconductor package including the semiconductor device that supports the built-in self-test operation in accordance with an embodiment of the present invention.

FIG. 3 is a block diagram illustrating a multi-semiconductor package including the semiconductor device that supports the built-in self-test operation in accordance with an embodiment of the present invention.

Referring to FIG. 3, the multi-semiconductor package includes a first semiconductor device 31 and a second semiconductor device 32. The first semiconductor device 31 includes a first signal transfer controller 316, a first internal circuit 314, and a first bump pad DBP1 and CBP1 that is set. The second semiconductor device 32 includes a built-in self-test controller 322, a second internal circuit 324, a second signal transfer controller 326, a second bump pad DBP2 and CBP2 that is set, and a set probe pad PP. Herein, the built-in self-test controller 322 includes a test result signal generation unit 3222, a test command generation unit 3224, and a test data generation unit 3226.

The first internal circuit 314 and the second internal circuit 324 have substantially the same circuit structure, and they may perform the same operation. In other words, the difference between the first internal circuit 314 and the second internal circuit 324 is that the first internal circuit 314 is included in the first semiconductor device 31 and the second internal circuit 324 is included in the second semiconductor device 32.

Likewise, the first bump pad DBP1 and CBP1 and the second bump pad DBP2 and CBP2 are substantially the same constituent element, and the difference between the first bump pad DBP1 and CBP1 and the second bump pad DBP2 and CBP2 is whether it is the constituent element of the first semiconductor device 31 or the second semiconductor device 32.

The first bump pad DBP1 and CBP1 and the second bump pad DBP2 and CBP2 are coupled with each other by sharing a command line C_LINE and a data line D_LINE.

To be specific, the first semiconductor device 31 receives a test command STC and test data STD through the set first bump pad DBP1 and CBP1 and performs a first test operation when a built-in self-test mode begins, and outputs a first test result data STRD1 generated as a result of the first test operation through the set first bump pad DBP1 and CBP1.

The second semiconductor device 32 generates the test command STC and the test data STD inside and performs a second test operation when the built-in self-test mode begins. The second semiconductor device 32 generates a second test result signal STRS2 corresponding to second test result data STRD2 that is generated as a result of the second test operation and a first test result signal STRS1 corresponding to the first test result data STRD1 inputted through the set second bump pad DBP2 and CBP2, and outputs the test command STC, the test data STD, the first test result signal STRS1, and the second test result signal STRS2 through the set second bump pad DBP2 and CBP2 and the set probe pad PP.

The built-in self-test controller 322 generates the test command STC and the test data STD when the built-in self-test mode begins, generates the first test result signal STRS1 in response to the first test result data STRD1 and generates the second test result signal STRS2 in response to the second test result data STRD2.

The test command generation unit 3224 generates the test command STC in response to a built-in self-test enable signal STEN. In other words, the test command generation unit 3224 generates the test command STC in a section where the built-in self-test enable signal STEN is enabled.

The test data generation unit 3226 generates the test data STD in response to the built-in self-test enable signal STEN. In other words, the test data generation unit 3226 generates the test data STD in a section where the built-in self-test enable signal STEN is enabled.

The test command STC and the test data STD may be diverse forms of signals corresponding to diverse test operations, and when and how they are generated may be pre-set in the process of circuit design. For example, it may be pre-set that one test command STC and one test data STD are generated whenever an operation clock (not shown toggles N times from a moment when the built-in self-test enable signal STEN is enabled.

The first internal circuit 314 performs the first test operation in response to the test command STC and the test data STD to generate the first test result data STRD1. Herein, the first test operation performed in the first internal circuit 314 may be an operation of diverse kinds, and how the test operation is to be performed may be pre-set in the process of circuit design.

The second internal circuit 324 performs the second test operation in response to the test command STC and the test data STD to generate the second test result data STRD2. Herein, the second test operation performed in the second internal circuit 324 may be an operation of diverse kinds, and how the test operation is to be performed may be pre-set in the process of circuit design.

The test command STC and the test data STD are inputted to the first internal circuit 314 to perform the first test operation and inputted to the second internal circuit 324 to perform the second test operation simultaneously. Herein, since the first internal circuit 314 and the second internal circuit 324 may have substantially the same circuit structure, and the first test operation and the second test operation may be regarded as substantially the same operation.

The test result signal generation unit 3222 generates the first test result signal STRS1 in response to the first test result data STRD1, and generates the second test result signal STRS2 in response to the second test result data STRD2. In other words, the first internal circuit 314 and the second internal circuit 324 may perform the first and second test operations in response to the test command STC and the test data STD to produce the first test result data STRD1 and the second test result data STRD2, and the test result signal generation unit 3222 may see if the first test result data STRD1 and the second test result data STRD2 have predetermined normal values, and decide the values of the first test result signal STRS1 and the second test result signal STRS2.

For example, when the first test operation is performed in the first internal circuit 314 and the first test result data STRD1 generated as a result of the first test operation have a predetermined normal value, it may be decided that the first internal circuit 314 performs a normal operation. Therefore, the test result signal generation unit 3222 may generate the first test result signal STRS1 having a value representing 'test succeeded'. Conversely, when the first test operation is performed in the first internal circuit 314 and the first test result data STRD1 generated as a result of the first test operation does not have the predetermined normal value, it may be decided that the first internal circuit 314 does not perform a normal operation. Therefore, the test result signal generation unit 3222 may generate the first test result signal STRS1 having a value representing 'test failed'.

Likewise, when the second test operation is performed in the second internal circuit 324 and the second test result data STRD2 generated as a result of the second test operation have a predetermined normal value, it may be decided that the second internal circuit 324 performs a normal operation. Therefore, the test result signal generation unit 3222 may generate the second test result signal STRS2 having a value representing 'test succeeded'. Conversely, when the second test operation is performed in the second internal circuit 324 and the second test result data STRD2 generated as a result of the second test operation does not have the predetermined normal value, it may be decided that the second internal circuit 324 does not perform a normal operation. Therefore, the test result signal generation unit 3222 may generate the second test result signal STRS2 having a value representing 'test failed'.

Of course, the first internal circuit 314 and the second internal circuit 324 are separate constituent elements respectively included in the first semiconductor device 31 and the second semiconductor device 32. Therefore, the first test result signal STRS1 and the second test result signal STRS2 may have the same value that represents either 'test succeeded' or 'test failed'. However, they may have different values. In other words, one between the first test result signal STRS1 and the second test result signal STRS2 may have a value representing 'test succeeded', and the other signal may have a value representing 'test failed'.

The first signal transfer controller 316 receives the test command STC and the test data STD through the set first bump pad DBP1 and CBP1 when the built-in self-test mode begins, and outputs the first test result data STRD1 through the set first bump pad DBP1 and CBP1. To be specific, the first signal transfer controller 316 receives the test command STC through a first command bump pad CBP1 of the set first bump pad DBP1 and CBP1 and receives the test data STD through a first data bump pad DBP1 of the set first bump pad DBP1 and CBP1, when the built-in self-test mode begins, and outputs the first test result data STRD1 through the first data bump pad DBP1 of the set first bump pad DBP1 and CBP1.

Also, the first signal transfer controller 316 receives the built-in self-test enable signal STEN for deciding whether to enter the built-in self-test mode through the first bump pad DBP1 and CBP1.

Also, the first signal transfer controller 316 receives a normal command NC through the first command bump pad CBP1 of the set first bump pad DBP1 and CBP1 and inputs/outputs normal data ND through the first data bump pad DBP1 of the set first bump pad DBP1 and CBP1, during a normal mode.

The second signal transfer controller 326 outputs the test command STC, the test data STD, the first test result signal STRS1, and the second test result signal STRS2 to the set probe pad PP when the built-in self-test mode begins. Since not only the first test result signal STRS1 and the second test result signal STRS2, but also the test command STC and the test data STD, are outputted to the set probe pad PP through the second signal transfer controller 326, it is possible not only to check the values of the first test result signal STRS1 and the second test result signal STRS2 but also to check the values of the test command STC and the test data STD through the set probe pad PP by using a probe of the test equipment outside the second semiconductor device 31. Therefore, it may be known what test operations are performed inside the first semiconductor device 31 and the second semiconductor device 32. In short, it is possible to check what built-in self-test operations are performed and whether the built-in self-test operations performed inside the first semiconductor device 31 and the second semiconductor device 32 have succeeded or failed even from outside of the second semiconductor device 32. In particular, since the set probe pad PP included in the second semiconductor device 32 may output not only the second test result signal STRS2 but also the first test result signal STRS1, the first semiconductor device 31 does not have to include any probe pad for outputting a test result.

Meanwhile, FIG. 3 shows that the test command STC, the test data STD, the first test result signal STRS1, and the second test result signal STRS2 are outputted through one set probe pad PP. Herein, since the test command STC and the test data STD are generated with similar timing, they may collide with each other when they are outputted through one set probe pad PP. Therefore, although not specifically illustrated in FIG. 3, the second signal transfer controller 326 may perform an additional operation of serializing the test command STC, the test data STD, the first test result signal STRS1, and the second test result signal STRS2 in a predetermined sequence and output them through the one set probe pad PP. Alternatively, the second semiconductor device 32 may include more than one set probe pad PP and output the test command STC, the test data STD, the first test result signal STRS1, and the second test result signal STRS2 in parallel. For example, the test command STC may be outputted through a first probe pad (not shown), and the test data STD may be outputted through a second probe pad (not shown), while the first test result signal STRS1 may be outputted through a third probe pad (not shown), and the second test result signal STRS2 may be outputted through a fourth probe pad (not shown).

Also, the second signal transfer controller 326 receives the first test result data STRD1 through the set second bump pad DBP2 and CBP2 and outputs the test command STC, the test data STD, the first test result signal STRS1, and the second test result signal STRS2 through the set second bump pad DBP2 and CBP2 as well as the set probe pad PP, when the built-in self-test mode begins. Since the test command STC and the test data STD are outputted by the second signal transfer controller 326 through the set second bump pad DBP2 and CBP2, it is possible for the first semiconductor device 31 that is coupled with the second semiconductor device 32 through a command line C_LINE and a data line D_LINE to receive the test command STC and the test data STD through the set first bump pad DBP1 and CBP1 and perform the first test operation.

Also, since the first test result signal STRS1 and the second test result signal STRS2 are outputted by the second signal transfer controller 326 through the set second bump pad DBP2 and CBP2, it is possible for a semiconductor controller (not shown) that is coupled with the second semiconductor device 32 through the set second bump pad DBP2 and CBP2 to receive the test command STC, the test data STD, the first test result signal STRS1 and the second test result signal STRS2 through the set second bump pad DBP2 and CBP2 and use them for a predetermined purpose. For example, the semiconductor controller (not shown) that shares the command line C_LINE and the data line D_LINE with the second semiconductor device 32 shown in FIG. 3 may receive the test command STC, the test data STD, the first test result signal STRS1, and the second test result signal STRS2 from the second semiconductor device 32, and figure out what built-in self-test operations are performed inside the first semiconductor device 31 and the second semiconductor device 32 and whether the built-in self-test operations have succeeded or failed. With this information, the semiconductor controller (not shown) may control the operations of the first semiconductor device 31 and the second semiconductor device 32 more efficiently.

Also, the second signal transfer controller 326 receives the built-in self-test enable signal STEN for deciding whether to enter the built-in self-test mode through the set second bump pad DBP2 and CBP2 or the set probe pad PP. In other words, the built-in self-test enable signal STEN may be transmitted from outside of the second semiconductor device 32 to the inside of the second semiconductor device 32 through a probe of the test equipment, or the built-in self-test enable signal STEN generated inside the semiconductor device controller (not shown) may be transmitted from the outside of the second semiconductor device 32 to inside of the second semiconductor device 32, for the second semiconductor device 32 to enter the built-in self-test mode. Herein, the input route of the built-in self-test enable signal STEN may be pre-set in the process of circuit design. Herein, FIG. 3 shows that the built-in self-test enable signal STEN is directly inputted through the set second bump pad DBP2 and CBP2 and the set probe pad PP, but this is merely an example, and there may be other methods. For example, the built-in self-test enable signal STEN may be generated inside the second semiconductor device 32 by decoding an input signal through a command decoding operation according to another embodiment of the present invention.

Also, the second signal transfer controller 326 receives a normal command NC through a second command bump pad CBP2 of the set second bump pad DBP2 and CBP2 and inputs/outputs normal data ND through a second data bump pad DBP2 of the set second bump pad DBP2 and CBP2, during a normal mode. In other words, the set second bump pad DBP2 and CBP2 may be used to receive the normal command NC and input/output the normal data ND when the normal mode begins, and be used to input/output the test command STC, the test data STD, the first test result signal STRS1 and the second test result signal STRS2 in the built-in self-test mode. In particular, differently from the general semiconductor device 10 shown in FIGS. 1A and 1B, the second semiconductor device 32 in accordance with the embodiment of the present invention uses the set second command bump pad CBP2 not only to receive the normal command NC or the built-in self-test enable signal STEN but also to output the test command STC. Therefore, the second signal transfer controller 326 includes both a signal input buffer and a signal output buffer that correspond to the set second command bump pad CBP2.

As described above, the first semiconductor device 31 includes the first internal circuit 314 as the target for the test operation and the first signal transfer controller 316 for transmitting the test command STC and the test data STD outputted from the second semiconductor device 32 to the first internal circuit 314 and outputting the first test result data STRD1 outputted from the first internal circuit 314 to the second semiconductor device 32. In short, the first semiconductor device 31 does not have a constituent element for performing a test operation on the first internal circuit 314 by itself. Despite those facts, since the test operation may be performed in response to the test command STC and the test data STD that are inputted from the second semiconductor device 32, it may be regarded that the built-in self-test operation is performed in the first semiconductor device 31, too. Herein, although there is one semiconductor device, which is the first semiconductor device 31, in FIG. 3 there may be a plurality of semiconductor devices (not shown) having the same structure as the first semiconductor device 31, and all the semiconductor devices (not shown) may perform a test operation in response to the test command STC and the test data STD that are inputted from the second semiconductor device 32.

Hereafter, a built-in self-test operation of the multi-semiconductor package having the above-described structure in accordance with the embodiment of the present invention is described.

First of all, the first semiconductor device 31 enters the built-in self-test mode in response to the enabling of the built-in self-test enable signal STEN that is inputted through the first bump pad DBP1 and CBP1 that is set. Concurrently the second semiconductor device 32 enters the built-in self-test mode in response to the enabling of the built-in self-test enable signal STEN that is inputted through the second bump pad DBP2 and CBP2 that is set and the set probe pad PP.

When the built-in self-test enable signal STEN is enabled, the built-in self-test controller 322 generates the test command STC and the test data STD. To be specific, the test data generation unit 3226 generates the test data STD, and the test command generation unit 3224 generates the test command STC. The test command STC and the test data STD generated in the test command generation unit 3224 and the test data generation unit 3226 are transmitted to the second internal circuit 324 while being outputted to the outside of the second semiconductor device 32 through the set second bump pad DBP2 and CBP2 and the set probe pad PP, simultaneously. Herein, the test command STC and the test data STD that are outputted through the set second bump pad DBP2 and CBP2 are inputted to the first semiconductor device 31 through the first bump pad DBP1 and CBP1 and transmitted to the first internal circuit 314.

The first internal circuit 314 performs a first test operation in response to the test command STC and the test data STD, and generates the first test result data STRD1, which is a value obtained from the test operation. For example, when it is described that the first internal circuit 314 is a circuit for storing data, the first internal circuit 314 may decide whether data are properly stored inside the first internal circuit 314 and output the decision result as the first test result data STRD1.

The second internal circuit 324 performs a second test operation in response to the test command STC and the test data STD, and generates the second test result data STRD2, which is a value obtained from the test operation. For example, when the second internal circuit 324 is a circuit for storing data, the second internal circuit 324 may decide whether data are properly stored inside the second internal circuit 324 and output the decision result as the second test result data STRD2.

The first test result data STRD1 is outputted to the outside of the first semiconductor device 31 through the first bump pad DBP1 and CBP1, inputted to the second semiconductor device 32 through the set second bump pad DBP2 and CBP2 and transmitted to the test result signal generation unit 3222. The test result signal generation unit 3222 generates the first test result signal STRS1 that represents whether the test operation is properly performed in the first internal circuit 314 in response to the first test result data STRD1.

The second test result data STRD2 is transmitted to the test result signal generation unit 3222. The test result signal generation unit 3222 generates the second test result signal STRS2 that represents whether the test operation is properly performed in the second internal circuit 324 in response to the second test result data STRD2.

The first test result signal STRS1 and the second test result signal STRS2, which are generated as described above, are outputted to the outside of the second semiconductor device 32 through the set probe pad PP and the set second bump pad DBP2 and CBP2. Therefore, it is possible to know from outside of the second semiconductor device 32 what kind of the built-in self-test operations are formed and whether the built-in self-test operations are properly performed inside the first semiconductor device 31 and the second semiconductor device 32.

In accordance with the embodiments of the present invention, since the test command and test data used for a built-in self-test operation inside a semiconductor device may be outputted to the outside of the semiconductor device, it is possible to check from outside of the semiconductor device whether the built-in self-test operation performed inside the semiconductor device is carried out properly.

Also, in accordance with the embodiments of the present invention, it is possible to transfer a test command and test data that are used for a built-in self-test operation inside one semiconductor device to other semiconductor devices and perform the built-in self-test operation in the other semiconductor devices as well as the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a built-in self-test controller suitable for generating a test command and test data, and generating a test result signal in response to test result data, in a built-in self-test mode;
an internal circuit suitable for performing a test operation in response to the test command and the test data and generating the test result data as a result of the test operation; and
a signal transfer controller suitable for outputting the test command, the test data, and the test result signal from the built-in self-test controller through a set probe pad and a set bump pad in the built-in self-test mode,
wherein the built-in self-test controller includes:
a test command generation unit suitable for generating the test command in the built-in self-test mode;
a test data generation unit suitable for generating the test data in the built-in self-test mode; and
a test result signal generation unit suitable for generating the test result signal in response to the test result data.

2. The semiconductor device of claim 1, wherein the signal transfer controller receives a built-in self-test enable signal for deciding whether to enter the built-in self-test mode through the set bump pad or the set probe pad.

3. The semiconductor device of claim 2, wherein the signal transfer controller receives a normal command through a command bump pad of the set bump pad and inputs/outputs normal data through a data bump pad of the set bump pad, in a normal mode.

4. The semiconductor device of claim 3, wherein the signal transfer controller outputs the test command through the command bump pad and the set probe pad, and outputs the test data and the test result signal through the data bump pad and the set probe pad, in the built-in self-test mode.

5. The semiconductor device of claim 4, wherein the signal transfer controller serializes the test command, the test data, and the test result signal in a predetermined sequence and outputs the test command, the test data, and the test result signal through the set probe pad, in the built-in self-test mode.

6. A multi-semiconductor package, comprising:
a first semiconductor device suitable for receiving a test command and test data through a first bump pad, performing a first test operation to produce first test result data as a result of the first test operation, and outputting the first test result data through the first bump pad, in a built-in self-test mode; and
a second semiconductor device suitable for generating the test command and the test data from within, performing a second test operation to generate second test result data as a result of the second test operation, generating a second test result signal corresponding to the second test result data and a first test result signal corresponding to the first test result data which is inputted through a second bump pad, and outputting the test command, the test data, the first test result signal, and the second test result signal through the second bump pad and a set probe pad, in the built-in self-test mode,
wherein the second semiconductor device includes a built-in self-test controller suitable for generating the test command and the test data, generating the first test result signal in response to the first test result data, and generating the second test result signal in response to the second test result data, in the built-in self-test mode,
wherein the built-in self-test controller includes:
a test command generation unit suitable for generating the test command in the built-in self-test mode;
a test data generation unit suitable for generating the test data in the built-in self-test mode; and
a test result signal generation unit suitable for generating the first test result signal in response to the first test result data and generating the second test result signal in response to the second test result data.

7. The multi-semiconductor package of claim 6, wherein the first semiconductor device includes:
a first internal circuit suitable for performing the first test operation in response to the test command and the test data and generating the first test result data as the result of the first test operation; and
a first signal transfer controller suitable for receiving the test command and the test data through the first bump pad, and outputting the first test result data through the first bump pad, in the built-in self-test mode.

8. The multi-semiconductor package of claim 7, wherein the first signal transfer controller receives a built-in self-test enable signal for deciding whether to enter the built-in self-test mode through the first bump pad.

9. The multi-semiconductor package of claim 8, wherein the first signal transfer controller receives a normal command through a first command bump pad of the first bump pad and inputs/outputs normal data through a first data bump pad of the first bump pad, in a normal mode.

10. The multi-semiconductor package of claim 9, wherein the first signal transfer controller receives the test command through the first command bump pad, and the test data through the first data bump pad, and outputs the first test result data through the first data bump pad, in the built-in self-test mode.

11. The multi-semiconductor package of claim 7, wherein the second semiconductor device further includes:
a second internal circuit suitable for performing the second test operation in response to the test command and the test data and generating the second test result data as the result of the second test operation; and
a second signal transfer controller suitable for receiving the first test result data through the second bump pad, and outputting the test command, the test data, the first test result signal, and the second test result signal through the set probe pad and the second bump pad, in the built-in self-test mode.

12. The multi-semiconductor package of claim 11, wherein the second signal transfer controller receives a built-in self-test enable signal for deciding whether to enter the built-in self-test mode through the second bump pad or the set probe pad.

13. The multi-semiconductor package of claim 12, wherein the second signal transfer controller receives a normal command through a second command bump pad of the second bump pad and inputs/outputs normal data through a second data bump pad of the second bump pad, in a normal mode.

14. The multi-semiconductor package of claim 13, wherein the second signal transfer controller receives the first test result data through the second data bump pad, and outputs the test command through the second command bump pad and the set probe pad, and outputs the test data, the first test result signal, and the second test result signal through the second data bump pad and the set probe pad, in the built-in self-test mode.

15. The multi-semiconductor package of claim 14, wherein the second signal transfer controller serializes the test command, the test data, the first test result signal and the second test result signal in a predetermined sequence and outputs the test command, the test data, the first test result signal and the second test result signal through the set probe pad, in the built-in self-test mode.

16. The multi-semiconductor package of claim 12, wherein when the built-in self-test enable signal is inputted to the second semiconductor device through the set probe pad, the second signal transfer controller outputs the built-in self-test enable signal through the second bump pad to transmit the built-in self-test enable signal to the first semiconductor device.

17. A multi-semiconductor package, comprising:
a plurality of semiconductor devices each suitable for performing a test operation in response to a test command and test data and generating test result data as a result of the test operation, in a built-in self-test mode,
wherein one of the semiconductor devices includes a built-in self-test controller suitable for generating the test command and the test data, and generating a test result signal corresponding to the test result data, and outputs the test command, the test data, and the test result signal through a probe pad thereof, in the built-in self-test mode,
wherein the built-in self-test controller includes:
a test command generation unit suitable for generating the test command in the built-in self-test mode;
a test data generation unit suitable for generating the test data in the built-in self-test mode; and
a test result signal generation unit suitable for generating the first test result signal in response to the first test result data and generating the second test result signal in response to the second test result data.

18. The multi-semiconductor package of claim 17, wherein the one of the semiconductor devices transmits the test command and the test data through a bump pad thereof to the other semiconductor devices, among the plurality of semiconductor devices, while receiving the test result data from the other semiconductor devices through the bump pad.

* * * * *